United States Patent [19]

McClure et al.

[11] Patent Number: 5,219,264
[45] Date of Patent: Jun. 15, 1993

[54] MOBILE ROBOT ON-BOARD VISION SYSTEM

[75] Inventors: Virge W. McClure; Nai-Yung Chen, both of Richardson, Tex.

[73] Assignee: Texas Instruments Incorporated, Dallas, Tex.

[21] Appl. No.: 508,504

[22] Filed: Apr. 10, 1990

Related U.S. Application Data

[63] Continuation of Ser. No. 326,465, Mar. 17, 1989, abandoned, which is a continuation of Ser. No. 191,834, May 9, 1988, abandoned, which is a continuation of Ser. No. 909,737, Sep. 19, 1986, abandoned.

[51] Int. Cl.$^5$ .............................................. B25J 5/00
[52] U.S. Cl. ...................................... 414/730; 901/1; 901/6; 901/47
[58] Field of Search ................. 414/730; 901/1, 6, 9, 901/46, 47; 250/222.1

[56] References Cited

U.S. PATENT DOCUMENTS

| | | | |
|---|---|---|---|
| 2,395,482 | 2/1946 | Hurley, Jr. | 250/222.1 X |
| 3,515,487 | 6/1970 | Hatcher, Jr. et al. | 250/222.1 X |
| 3,881,605 | 5/1975 | Grossman | 901/9 X |
| 3,973,685 | 8/1976 | Loomer | 901/1 X |
| 4,219,847 | 8/1980 | Pinkney et al. | 901/9 X |
| 4,295,740 | 10/1981 | Sturges, Jr. | 901/46 X |
| 4,380,696 | 4/1983 | Masaki | 901/47 X |
| 4,402,053 | 8/1983 | Kelley et al. | 414/730 X |
| 4,453,085 | 6/1984 | Pryor | 901/47 X |
| 4,460,826 | 7/1984 | Pryor | 901/47 X |
| 4,483,407 | 11/1984 | Iwamoto et al. | 901/1 X |
| 4,583,852 | 4/1985 | Cassidy et al. | 356/152 |
| 4,613,942 | 9/1986 | Chen | 250/222.1 X |
| 4,636,137 | 1/1987 | Lemelson | 901/46 X |
| 4,679,152 | 7/1987 | Perdue | 901/1 X |
| 4,680,811 | 7/1987 | Harper et al. | 901/1 X |
| 4,691,446 | 9/1987 | Pitches et al. | 414/730 X |
| 4,698,775 | 10/1987 | Koch et al. | 901/46 X |
| 4,753,569 | 6/1988 | Pryor | 901/47 X |
| 4,853,771 | 8/1989 | Witriol et al. | 901/9 X |

FOREIGN PATENT DOCUMENTS

| | | | |
|---|---|---|---|
| 114505 | 8/1984 | European Pat. Off. | 901/9 |
| 135399 | 8/1984 | Japan | 901/1 |
| 8601608 | 3/1986 | PCT Int'l Appl. | 250/222.1 |
| 457970 | 4/1975 | U.S.S.R. | 901/47 |

OTHER PUBLICATIONS

Ruoff, C. F., "PACS-An Advanced Multitsking Robot System", The Industrial Robot, Jun. 1980.
Fairchild Video Communications Camera Brochure, Published Sep. 1982, 4 pgs.
"The Orientation Of Components For Automatic Assembly", *Assembly Automation*, Nov. 1980.
"Guide To Limit Switches" *Product Engineering*, Nov. 12, 1962.

*Primary Examiner*—Michael S. Huppert
*Assistant Examiner*—William M. Hienz
*Attorney, Agent, or Firm*—Gary C. Honeycutt; Richard L. Donaldson; William E. Hiller

[57] ABSTRACT

A mobile robot or automatic guided vehicle having a multijointed robot arm. The robot arm has a gripper and charge coupled device camera mounted at the free end of the arm. The gripper is for engaging, holding and releasing workpieces. The robot arm transfers workpieces to and from process machines or storage areas. The robot arm finds the workpiece or the place to set it down by looking at two light emitting diodes placed a known distance and orientation away from the workpiece or set down place. The robot arm and camera are controlled by a computer on board the vehicle. The automatic guided vehicle and robot arm are used to transfer workpieces from place to place in an automated manufacturing environment.

1 Claim, 6 Drawing Sheets

MOBILE ROBOT ON-BOARD VISION SYSTEM

This application is a continuation of Ser. No. 07/326,465 filed Mar. 17, 1989, now abandoned, which was a continuation of Ser. No. 07/191,834 filed May 9, 1988, now abandoned, which was a continuation of Ser. No. 06/909,737 filed Sep. 19, 1986, now abandoned.

BACKGROUND OF THE INVENTION

1. FIELD OF THE INVENTION

This invention pertains to mobile robots or automatic guided vehicles (AGVs) and more particularly, to computer control and processing of visual images from a CCD camera in a computer controlled robotic arm.

2. DESCRIPTION OF THE RELATED ART

Present day assembly processes, such as automated flexible manufacturing systems or cells for manufacturing small, delicate parts such as integrated circuits, require that accurate workpiece transfer takes place between an automatic guided vehicle (hereinafter, AGV) and an assembly or process machine, or a workpiece storage location. The problem is highlighted in those systems in which fully automatic operation without human intervention is desired to complete the workpiece transfer. Typically, present day material handling systems require a high degree of docking or parking accuracy for such workpieces to be transferred successfully without human assistance.

Particularly where small workpieces are involved, the typical AGV is not able to ascertain the precise location of a workpiece prior to transferring it automatically between the AGV and a process machine or storage location.

Also desirable for successful workpiece transfer is for the presence or absence of a workpiece to be detectable. That is, if there is no workpiece at a process machine, that fact should be ascertainable automatically.

Related to the problem of accurate workpiece transfer is the task of ensuring accurate parking of an AGV. Often, stops or cone shaped devices are used for mechanically guiding an AGV into a docking or parking position. These mechanical devices present the disadvantages of vibrating the AGV and of finding a suitable place in which to locate and mount them.

SUMMARY OF THE INVENTION

The present invention provides for a CCD camera mounted on the gripper end of a flexible, workpiece-manipulating, robot arm, which is in turn mounted upon an AGV or mobile robot. The gripper end of the robot arm includes a computer controllable gripper for grasping and releasing workpieces. The camera is rigidly mounted adjacent to the gripper and has fixed coordinates in the gripper coordinate system, or frame of reference. The invention also provides for at least two active or passive locating beacons in known positions with respect to the workpiece nest on a process machine. The beacons are detected by the camera and the visual information is then sent to a control computer on board the AGV, which processes the information and guides the robot arm in picking up or depositing workpieces. The visual information also can be used to guide the robot arm in pushing a switch located on the process machine, for the purpose of letting the process machine know that the AGV is ready to load or unload a workpiece.

During a workpiece transfer sequence, the robot arm is guided with high precision to a workpiece nest, from which a workpiece is picked up or deposited, whichever the case may be. The high accuracy is achieved by use of the CCD camera, which provides visual information to the AGV computer about the position of the beacons with respect to the gripper end of the robot arm. This aspect of the invention is advantageous over prior art techniques in that the CCD camera being used as a guidance sensor is located adjacent to the gripper, giving a greatly expanded scale of view of the beacons with respect to the gripper. Also, because the camera is fixed in the gripper coordinate system, the camera always points in the same direction relative to the gripper, no matter how the gripper end of the robot arm is tilted or rotated. Thus, the targeted beacons can always be kept in view as the gripper moves toward the workpiece nest. This high degree of manipulative accuracy allows the robot arm to transfer very small parts, such as are associated with integrated circuit manufacture. Fully automatic parts transfer is, therefore, possible without necessity of human assistance.

Because the robot arm gripper end can be accurately positioned anywhere within the reach of the arm, the AGV docking accuracy requirements correspondingly can be less. This is advantageous over prior art systems in which an AGV must be positioned with greater accuracy to effect successful load transfers. Not only is greater parking accuracy more difficult to achieve technically, but it is more expensive as well, since costlier guidance equipment must be used.

One of the embodiments of the invention includes a beacon located in the workpiece nest. From the perspective of the CCD camera in the robot arm, the view of the beacon is blocked when a workpiece is present in the workpiece nest, and is not blocked when a workpiece is not present. Thus, the control computer can determine whether or not a workpiece is present in the nest. This feature prevents one workpiece from being placed upon another already in the nest, and prevents the AGV from attempting to pick up a workpiece which is not there. The task of material tracking is simplified as well, since the control computer can inform a supervisory computer that a workpiece is already at the designated process machine or that an expected workpiece is not there.

Another embodiment of the invention utilizes the robot arm and CCD camera to achieve greater parking accuracy than may be obtainable from the primary navigation system. In this embodiment, the computer on board the AGV responsible for navigation receives data from the control computer. When the AGV gets within robot arm's length of the expected position of the desired parking location, the robot arm and camera search for the locating beacons on the process machine or other parking place and when they are found, the AGV navigation computer is able to determine with precision the AGV location with respect to the desired parking place. The guidance system then can accurately bring the AGV into the desired parking position.

In a further embodiment, the robot arm is used to press a switch located on a process machine, to inform the process machine that a workpiece transfer is desired. A beacon is located near the switch and is for indicating the location of the switch to the CCD camera which, in cooperation with the control computer, guides the gripper end of the robot arm into sufficiently forceful contact with the switch to trip it. This beacon also is useful for signaling to the AGV as a part of a handshaking sequence.

One of the advantages of the invention is in providing a single structure, namely, the robot arm and CCD camera, to effect more than one of the above features of the invention.

A further advantage to using the CCD camera is its small size and weight, which is an important consideration when, as here, the camera is mounted upon the robot arm.

These and other objects and advantages of the invention will be apparent from a reading of the specification in conjunction with the figures.

DESCRIPTION OF THE PREFERRED EMBODIMENTS

Figure 1:
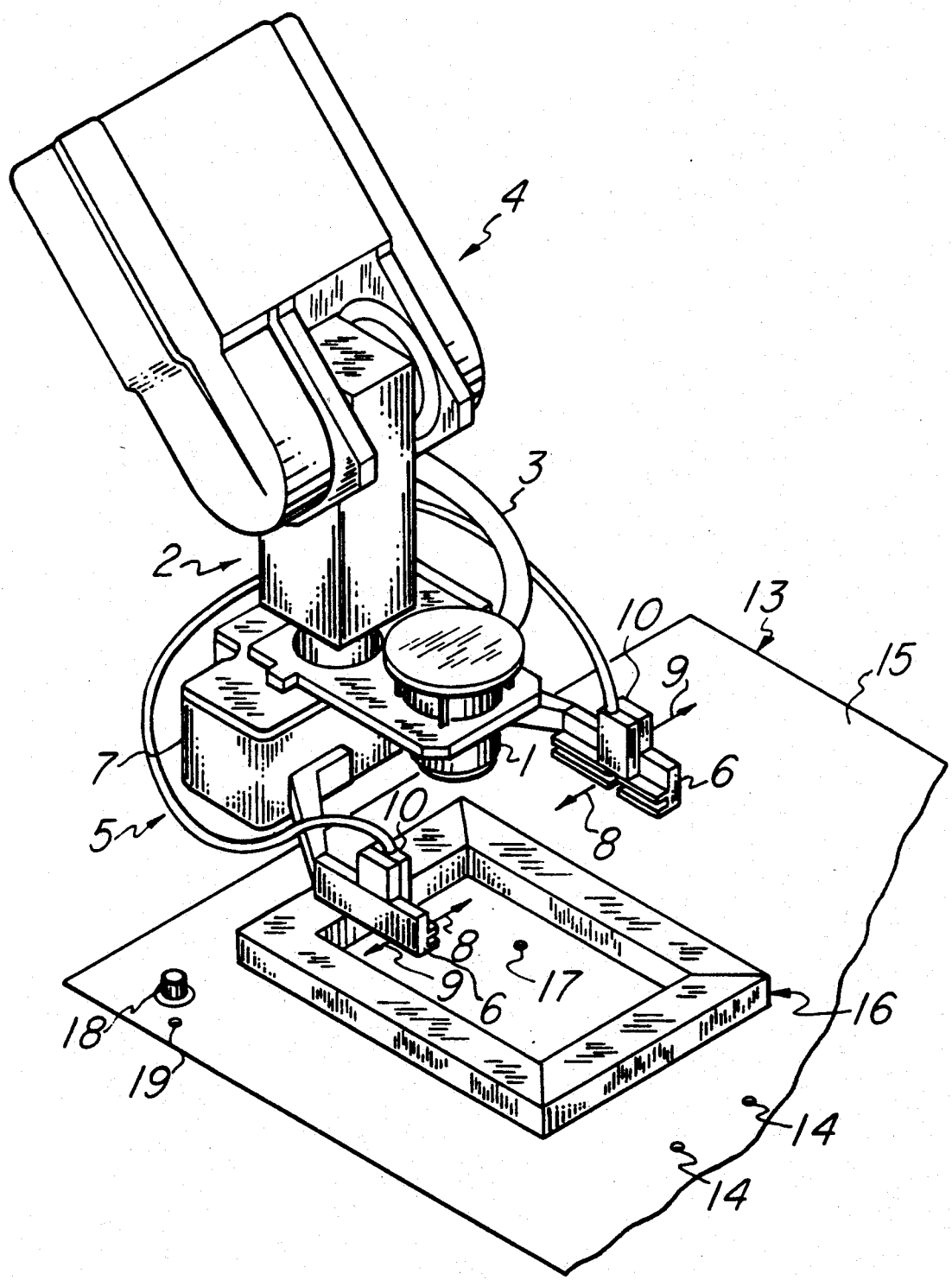
FIG. 1 is a perspective view showing the gripper end of the robot arm with the CCD camera mounted just above the gripper, and showing a workpiece nest and beacons on a process machine.
Figure 11:
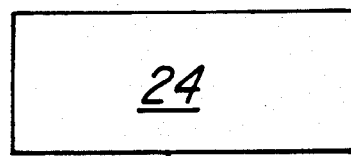
FIG. 11 is a block diagram showing the control computer, CCD camera and robot arm.
Figure 11:
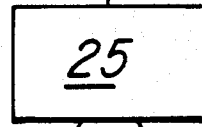

As seen in FIG. 1, a charge coupled device (CCD) camera 1 is mounted upon a robot arm gripper end 2. A vision cable 3 extends from the CCD camera back along the robot arm 4 to a general purpose computer (referred to herein as the control computer 24, shown in FIG. 11) via interface circuitry 25 well known in the art. The robot arm 4 is connected to the control computer 24 via interface circuitry 25, as shown in FIG. 11. Also mounted upon the robot arm gripper end 2, immediately subjacent to the CCD camera 1, is a gripper assembly 5 which includes opposing gripper fingers 6. The gripper fingers 6 are slidably mounted in an actuation box 7 in which there is a motor controlled by the control computer 24 to actuate a set of gears to slidably move simultaneously the fingers 6 together or apart, in the direction of the arrows 8 or 9 respectively on each finger 6 is workpiece sensor 10 to sense the presence or absence of a workpiece, such as the workpiece 11 shown in FIG. 2. Preferably, the sensors 10 are well known optical sensors or proximity detectors.

Figure 2:
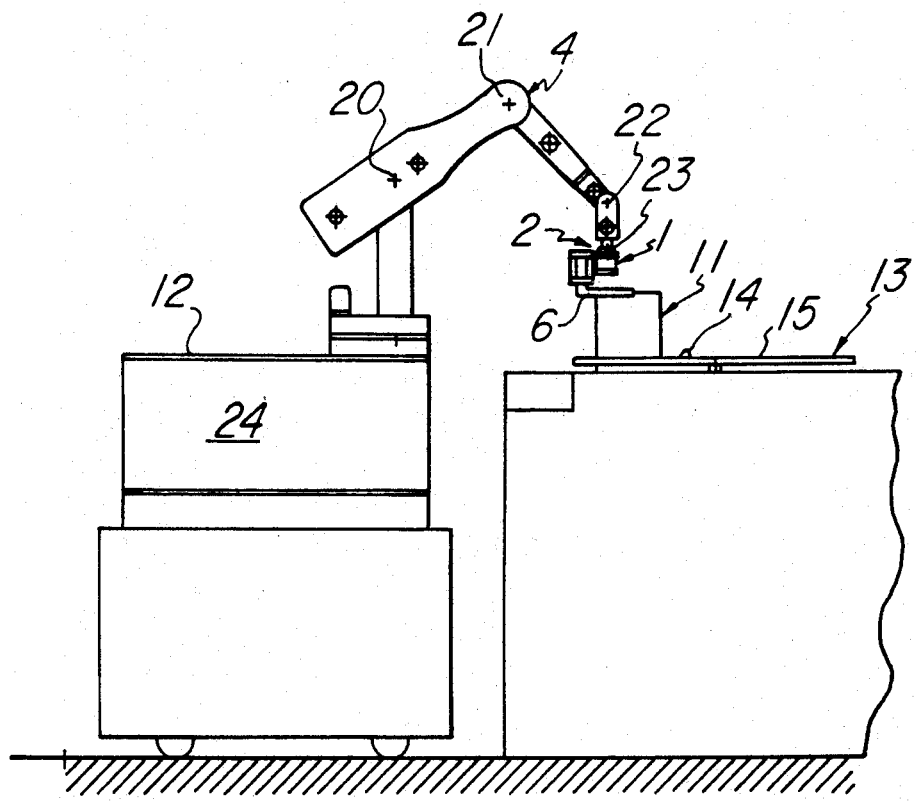
FIG. 2 is a side view showing an AGV with its robot arm manipulating a workpiece on a process machine.

As seen in FIG. 2, the robot arm 4 is multijointed which gives it great flexibility. Joints can be seen at 20, 21, 22 and 23. Joint 23 is a swivel joint which allows the robot arm gripper end 2 to rotate about its axis.

Turning now to FIG. 2, an AGV 12 is shown upon which is mounted a robot arm 4 with a workpiece 11 held by the gripper fingers 6. The robot arm 4 and workpiece are shown in a position in which the robot arm can either deposit the workpiece by moving the gripper fingers 6 apart, or remove the workpiece by moving the fingers 6 together and retracting the robot arm toward the AGV 12. To deposit the workpiece requires spreading the fingers 6 until both of the the workpiece sensors 10 indicate to the control computer 24 that they no longer detect the presence of the workpiece 11. Similarly, removing the workpiece 11 from the process machine 13 requires that the fingers 6 be moved toward each other a sufficient distance to cause both workpiece sensors 10 to detect the presence of the workpiece.

Referring back to FIG. 1, a pair of locating beacons 14 is positioned in the upper surface 15 of the process machine 13, near a workpiece nest 16. The workpiece nest 16 is for holding a workpiece while operations are carried out upon it by the process machine. The two locating beacons 14 preferably are a pair of light emitting diodes (LEDs) and are detectable by the CCD camera 1.

After the locating beacons 14 have been detected by the CCD camera 1, the control computer 24 processes the visual information from the camera 1, and from it determines positions of the locating beacons 14 with respect to the robot arm. The control computer 24 has stored in its memory the expected position of the workpiece nest with respect to the locating beacons, thus, after the control computer 24 knows the position of the locating beacons with respect to the robot arm, it is simple geometry to calculate the position of the workpiece nest with respect to the robot arm. With the position of the workpiece nest relative to the robot arm 4 known, the control computer 24 knows with great precision where to direct the robot arm in order to deposit or remove workpieces from the process machine 13.

One embodiment of the invention includes a nest beacon 17 located within a workpiece nest 16 as shown in FIG. 1. Preferably, this beacon also is an LED. The nest beacon 17 is visible to the CCD camera 1 when a workpiece is not present in the nest, and the nest beacon is not visible when the workpiece is in the nest. Consequently, prior to beginning a load/unload sequence, the control computer 24 can quickly determine whether or not a workpiece is already present in the nest by directing the robot arm to train the CCD camera 1 on the expected position of the nest.

Another embodiment of the invention includes a pushbutton switch 18 and closely adjacent switch beacon 19, both mounted on the upper surface 15 of the process machine 13, as shown in FIG. 1. Preferably, the switch beacon 19 is an LED. Ideally, the process machine 13 is computer controlled, and the switch beacon 19 and pushbutton switch 18 are used for positive handshaking between the AGV and process machine by pressing the switch with the robot arm gripper assembly 5 and monitoring the on/off condition of the beacon with the CCD camera 1.

The control computer 24 locates the pushbutton switch 18 by finding the switch beacon 19 with the CCD camera 1. The gripper assembly 5 is sufficiently, large and the pushbutton switch 18 close enough to the switch beacon 19 to allow the control computer simply to direct the gripper assembly toward the switch beacon and be assured of coming into contact with the pushbutton switch.

It is obvious that infrared (IR) LEDs could be used to perform the handshake sequence rather than using the LED/pushbutton-switch combination. In a similar vein, IR LEDs, or any other wavelength, could be used for all the beacons. IR is attractive since it is well known that typical CCD cameras are most sensitive to IR wavelengths, however, LEDs in the visible spectrum are preferred since it is easier to spot malfunctioning units.

It is obvious that the locating beacons 14 can also be provided for storage locations as well as for the processing locations on the process machines. Thus, the AGV could store and retrieve parts from storage.

SYSTEM OPERATION

Figure 3:
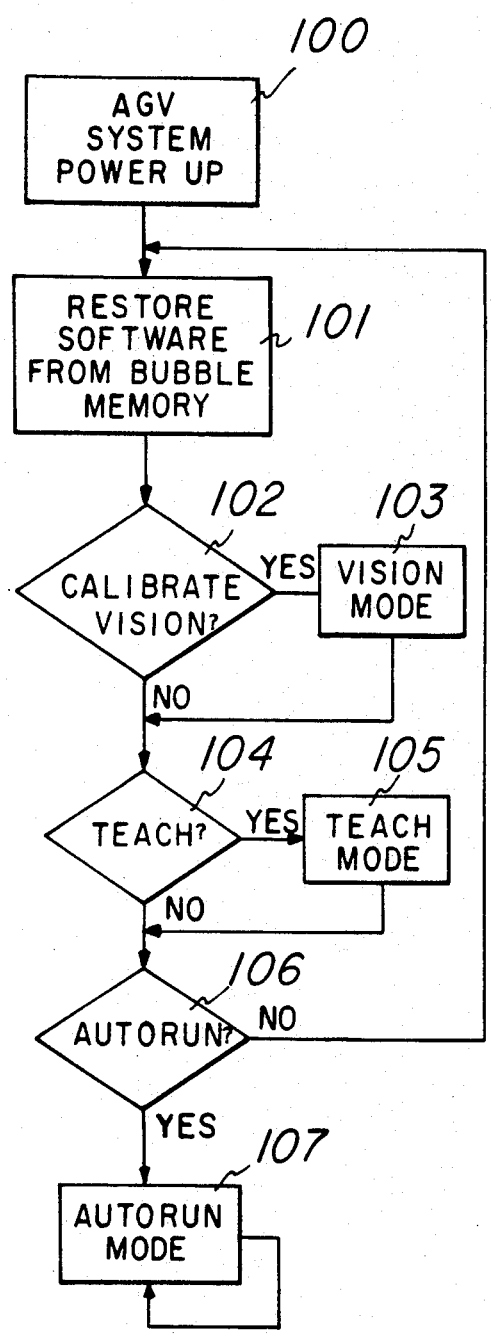
FIG. 3 is a system level block diagram.

Turning now to FIG. 3, an overall system view of the AGV workpiece transfer system is shown. After the AGV powers up at 100, the control computer 24 transfers from bubble memory, or other nonvolatile mass storage, the software necessary to run the AGV workpiece transfer system, as seen at 101. At 102 the decision is made by a human operator whether or not to calibrate the vision system. If the vision system has never been calibrated or if recalibration is required due to anything which could have caused rotation of the x-y plane of the CCD camera coordinate system about the optical axis of the CCD camera 1, then the operator will choose to calibrate the vision system at 103.

Figure 4:
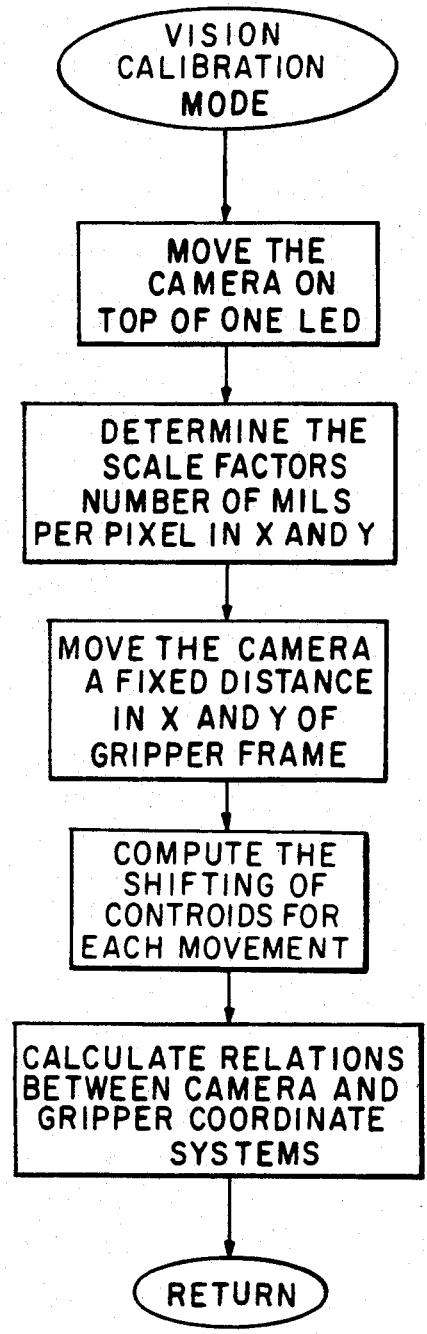
FIG. 4 is a block diagram illustrating the vision calibration mode.

The vision calibration mode is illustrated in FIG. 4. The purpose of this mode is to find the relationship between the CCD camera x-y coordinate system and the gripper x-y coordinate system. The two x-y planes can be made parallel by mechanical alignment, however, it is more difficult to mechanically rotate the camera 1 to make sure that the two x-axes are parallel and the two y-axes are parallel. Thus, any rotational angle between the two sets of axes is found by the vision calibration mode 103, and coordinates of objects seen by the CCD camera 1 are adjusted mathematically by the control computer 24 to be in terms of the gripper coordinate system. Because both the camera 1 and gripper assembly 5 are mounted on the same structure (the robot arm gripper end 2), the relationship between the two coordinate systems remains fixed as long as none of the component parts of the gripper assembly or CCD camera are changed or otherwise disturbed.

The overall frame of reference for the AGV workpiece transfer system is the AGV base coordinate system, and it is in this coordinate system that the control computer 24 works when it calculates the positions of the various structures, e.g., workpiece nest 16, located on the process machine 13. Therefore, the coordinates of objects detected by the CCD camera 1 must eventually be put in terms of the base coordinate system. The mechanical geometry of the robot arm is well known to the control computer 24, so, the coordinates of objects in the gripper coordinate system can be mathematically transformed by the control by determining in vision calibration mode 103 the mathematical relationship between the CCD camera coordinate system and the gripper coordinate system, the control computer 24 can mathematically transform coordinates from the CCD camera coordinate system into coordinates in the AGV base coordinate system.

Figure 8:
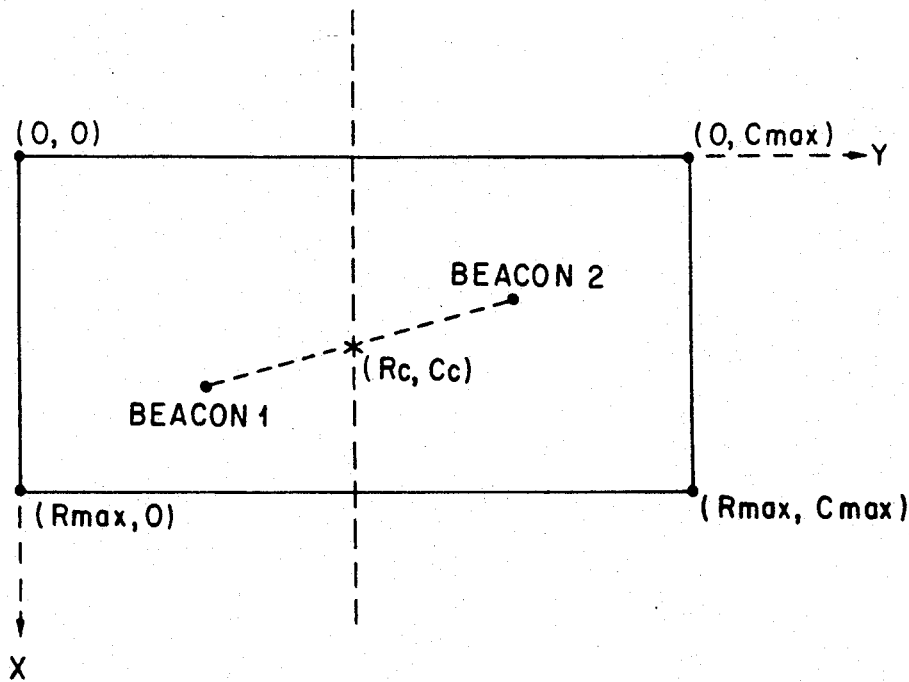
FIG. 8 shows the windows used in calculating centroids.
Figures 5, 6:
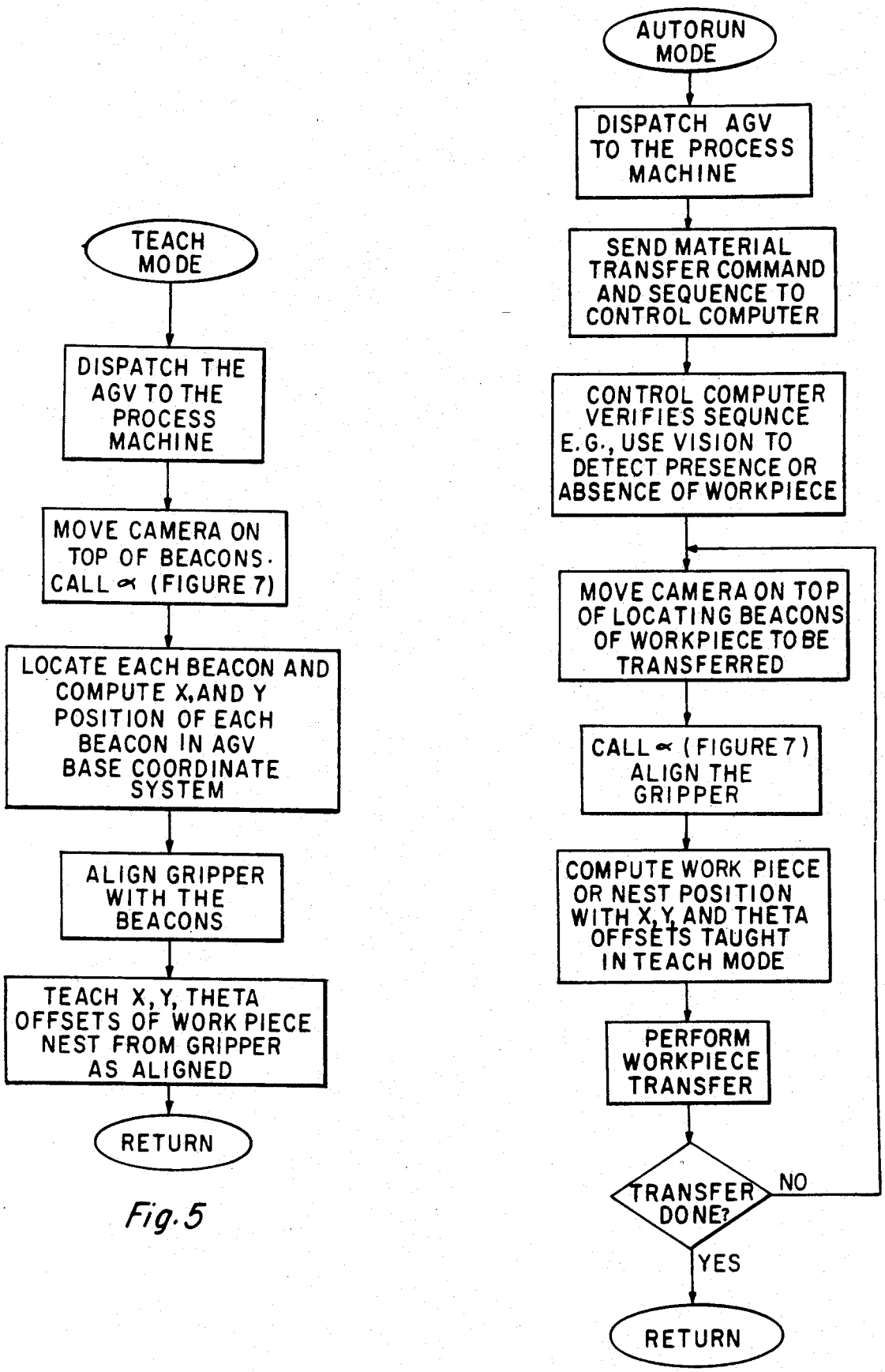
FIG. 5 is a block diagram illustrating the teach mode.
FIG. 6 is a block diagram illustrating the playback mode.
Figure 7:
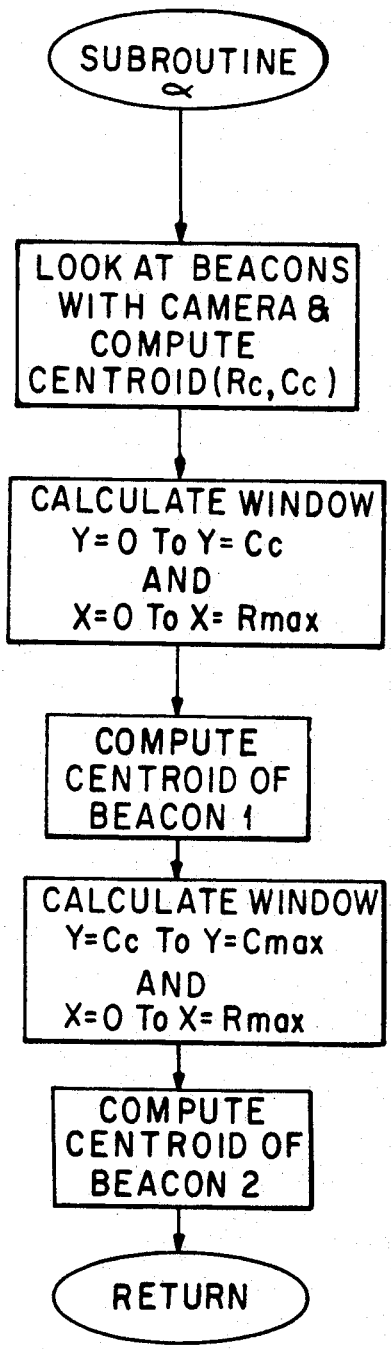
FIG. 7 is a block diagram illustrating the subroutine used by the teach and playback modes to calculate centroids.

Returning to FIG. 3, the human operator decides at 104 whether or not to enter the teach mode 105. The purpose of the teach mode 105 is to find and store in the control computer 24 memory, the AGV base coordinates of each beacon, and the x, y and theta offsets for the workpiece nests, for each of the different logical process machine layouts of beacons and workpiece nest. Theta is an angle measured from a line parallel to the x-axis in the x-y plane. As an example, in a flexible manufacturing cell with ten process machines, there may be only three logical layouts involved. That is, more than one machine will have the same arrangement of beacons and workpiece nest with the same geometrical spacings and angles between the respective beacons and workpiece nest. Some of these logical layouts will have a pushbutton switch 18 associated with one of the beacons 19, and one embodiment of the invention includes a nest beacon 17 inside each workpiece nest 16. The teach mode 105 is illustrated in FIGS. 5, 7 and 8.

Turning again to FIG. 3, the human operator decides at 106 whether or not to enter the autorun mode 107. The autorun mode is the working mode for the AGV workpiece transfer system in which the AGV is transferring workpieces to and from various process machines or storage locations. The autorun mode is illustrated in FIGS. 6, 7 and 8.

Figure 9:
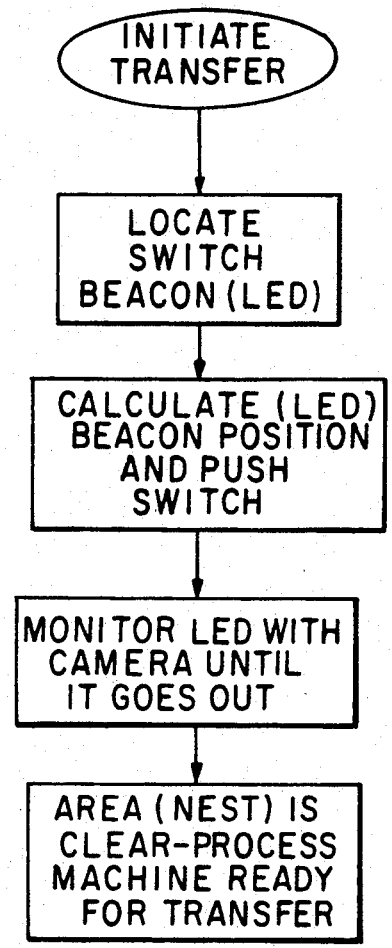
FIG. 9 is a block diagram illustrating the handshake sequence between an AGV and a process machine to initiate workpiece transfer between the AGV and the process machine.
Figure 10:
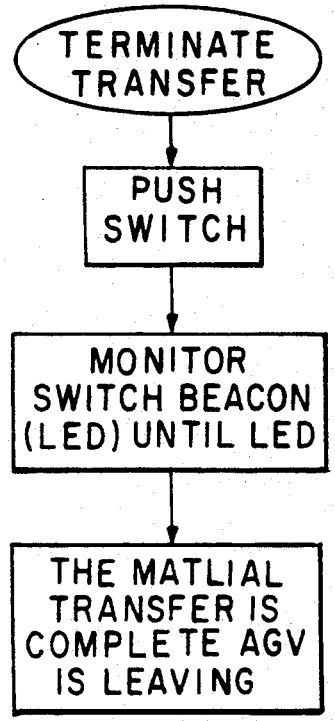
FIG. 10 is a block diagram illustrating the handshake sequence between an AGV and a process machine at the termination of workpiece transfer between the AGV and the process machine.

FIG. 9 illustrates the handshake sequence between an AGV 12 and a process machine 13 which takes place prior to workpiece transfer. One of the purposes of the handshake is to inform both the AGV and the process machine that the other is ready to begin workpiece transfer. FIG. 10 illustrates the handshake sequence which takes place between the AGV and the process machine after a workpiece has been successfully transferred. One of the purposes of the ending handshake is to let both the AGV and process machine know that the workpiece transfer has concluded and each of the parties to the transfer can now proceed with other tasks. A further purpose served by both handshake sequences is relevant where a central computer is scheduling work, keeping track of material flow, and controlling the AGV and process machines. That purpose is that the central computer is informed in a positive way when work is, and is not, successfully started and completed.

We claim:

1. An automatic robot system comprising:
   an AGV transporting and transferring workpiece,
   a control computer on board the AGV,
   a process machine for working on workpieces,
   a flexible robot arm with a gripper comprising two gripper fingers at one end of the arm, wherein the robot arm and gripper are controllable by the control computer for engaging a workpiece, picking it up, and setting it down and releasing it at a commanded location,
   locating beacon means mounted on the process machine, wherein the locating beacon means are for locating on the process machine a place to pick up and set down workpieces,
   vision means, including a camera fixed in the coordinate system of the gripper means, attached to the robot arm near the gripper, such that the space between said gripper fingers lies within the vision field of said vision means, for detecting the locating beacon means, wherein the vision means provides the control computer visual information relating to the location of the locating beacon means, from which information the computer is able to calculate the pick up and set down place on the process machine, wherein said place for picking up and setting down workpieces on the process machine is a nest means and further serves the function of holding a workpiece in place while it is worked on, the robot system further comprising nest beacon means located in the nest means detectable by the vision means for providing information to the control computer as to whether or not a workpiece is present in the nest means.

* * * * *